United States Patent
Hartono et al.

(10) Patent No.: US 7,274,607 B2
(45) Date of Patent: Sep. 25, 2007

(54) BITLINE EXCLUSION IN VERIFICATION OPERATION

(75) Inventors: Hendrik Hartono, San Jose, CA (US); Aaron Yip, Santa Clara, CA (US); Benjamin Louie, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 11/153,188

(22) Filed: Jun. 15, 2005

(65) Prior Publication Data

US 2006/0285390 A1    Dec. 21, 2006

(51) Int. Cl.
*G11C 7/12* (2006.01)

(52) U.S. Cl. ............. 365/195; 365/185.22; 365/189.05
(58) Field of Classification Search ................. 365/195
See application file for complete search history.

(56) References Cited

U.S. PATENT DOCUMENTS

| 5,200,922 | A | * | 4/1993 | Rao ...................... 365/185.09 |
| 5,323,353 | A | * | 6/1994 | Griffus et al. .............. 365/226 |
| 5,561,629 | A | | 10/1996 | Curd |
| 5,841,712 | A | | 11/1998 | Wendell et al. |
| 5,930,169 | A | * | 7/1999 | Iwata et al. ............ 365/185.09 |
| 6,041,007 | A | | 3/2000 | Roeckner |
| 6,055,207 | A | * | 4/2000 | Nam .......................... 365/233 |
| 6,201,738 | B1 | * | 3/2001 | Hebishima ............. 365/185.21 |
| 6,275,443 | B1 | * | 8/2001 | Ingalls et al. .......... 365/230.08 |
| 6,282,121 | B1 | * | 8/2001 | Cho et al. .............. 365/185.22 |
| 6,421,757 | B1 | | 7/2002 | Wang et al. |
| 7,057,954 | B2 | | 6/2006 | Kim |

* cited by examiner

*Primary Examiner*—Tan T. Nguyen
(74) *Attorney, Agent, or Firm*—Leffert Jay & Polglaze, P.A.

(57) ABSTRACT

Methods and apparatuses for disabling a bad bitline for verification operations, and for determining whether a programming operation have failed, include setting a bitline disable latch for a bad bitline, and inhibiting operation of a program latch if the bitlines is excluded or if a programming operation fails.

40 Claims, 4 Drawing Sheets

BITLINE EXCLUSION IN VERIFICATION OPERATION

FIELD

The present invention relates generally to integrated circuits and in particular the present invention relates to programming and verification operations in integrated circuits.

BACKGROUND

Memory devices are typically provided as internal, semiconductor, integrated circuits in computers or other electronic devices. In general, memory devices contain an array of memory cells for storing data, and row and column decoder circuits coupled to the array of memory cells for accessing the array of memory cells in response to an external address. There are many different types of memory including random-access memory (RAM), read only memory (ROM), dynamic random access memory (DRAM), synchronous dynamic random access memory (SDRAM), and flash memory.

A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate. In a flash memory, erased cells have a low threshold voltage, and are conductive. Erased cells are said to have a logic "1" value programmed cells have a higher threshold voltage, are less conductive, and are said to have a logic "0" value. Programming and erasing of typical flash memory cells will not be described further herein.

Flash memory typically utilizes one of two basic architectures known as NOR flash and NAND flash. The designation is derived from the logic used to read the devices. In NOR flash architecture, a column of memory cells are coupled in parallel with each memory cell coupled to a bitline. In NAND flash architecture, a column of memory cells are coupled in series with only the first memory cell of the column coupled to a bitline.

Memories such as those described herein are subject to failure of components due to any number of factors. Therefore, redundancies are typically built in to memories, to allow for operation even if some of the components fail. Redundancies in memory devices allow for the invalidation of faulty bitlines and the moving of data to a redundant area of the array. Once a bitline is faulty, it is a waste of valuable power to continue operations on that bitline.

In a program operation of a page/row of the memory array, after the data is programmed to the array, it is typically immediately read again from memory array so that the data can be verified. In this verification, the data that was programmed in the memory array is compared with the original data typically still being held in the I/O buffer or data cache to discover any errors and ensure it was properly programmed. If an error is discovered, the location is typically invalidated and the data moved to a new location to be programmed into the array once again.

For the reasons stated above, and for other reasons stated below which will become apparent to those skilled in the art upon reading and understanding the present specification, there is a need in the art for improved power management in memories.

SUMMARY

The above-mentioned problems with programming and verification in memories and other problems are addressed by the present invention and will be understood by reading and studying the following specification.

In one embodiment, a method of performing operations on a bitline in a memory device includes setting a bitline disable latch with a first logic signal indicating exclusion of the bitline or with a second complementary logic signal indicating that the bitline is available for operations.

In another embodiment, a method of determining whether a programming operation on a bitline in a memory has failed includes loading a bitline disable latch with a first logic level signal, loading a program latch with a second logic level signal complementary to the first logic level signal, attempting to program a bit, determining whether the bit has programmed, and indicating a failed programming if the bit exhibits an erase threshold voltage.

In yet another embodiment, a method of monitoring programming and verification on a bitline in a memory includes inhibiting operation of a program latch if a bitline is excluded from operation, inhibiting operation of the program latch if a bitline is available for operations and the bitline fails a programming operation, and indicating a failure of programming if the bitline fails the programming operation.

Other embodiments are described and claimed.

BRIEF DESCRIPTION OF DRAWINGS

FIG. 3 is a circuit diagram of; and

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

In the various embodiments of the present invention, each sense amplifier (SA) that is dedicated to one bitline has its own bitline disable latch. The purpose of the bitline disable latch is to exclude a faulty bitline from any program and program verify operations in the memory device.

Figure 1:
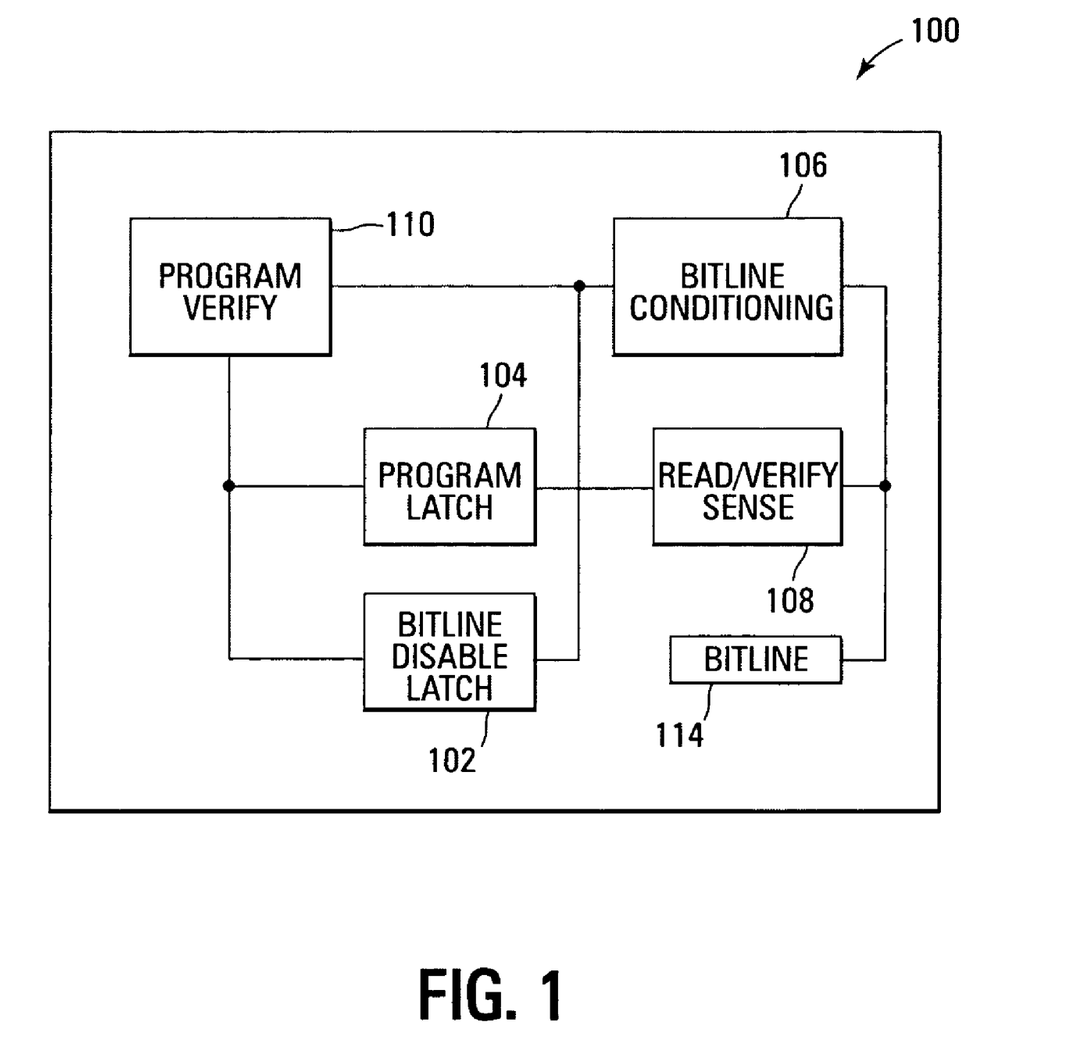
FIG. 1 is a block diagram of a circuit according to one embodiment of the present invention.

A circuit 100 for operation of enabling or disabling a bitline in a memory device is shown in FIG. 1. Circuit 100 comprises a bitline disable latch 102, a program latch 104, a bitline conditioning circuit 106, a read/verify sense circuit 108, a program verify circuit 110, and a bitline 114. The bitline disable latch is programmed to either allow or prohibit memory operations on the bitline. The program latch is inhibited when a bad bitline is indicated, or when the programming of a bit is compromised. Each bitline of a memory, such as a NAND flash memory, has its own circuit such as circuit 100, and the circuits 100 are coupled to a common node, so that if any program latch in the memory system fails, that failure will pull the common node to ground.

Figure 2:
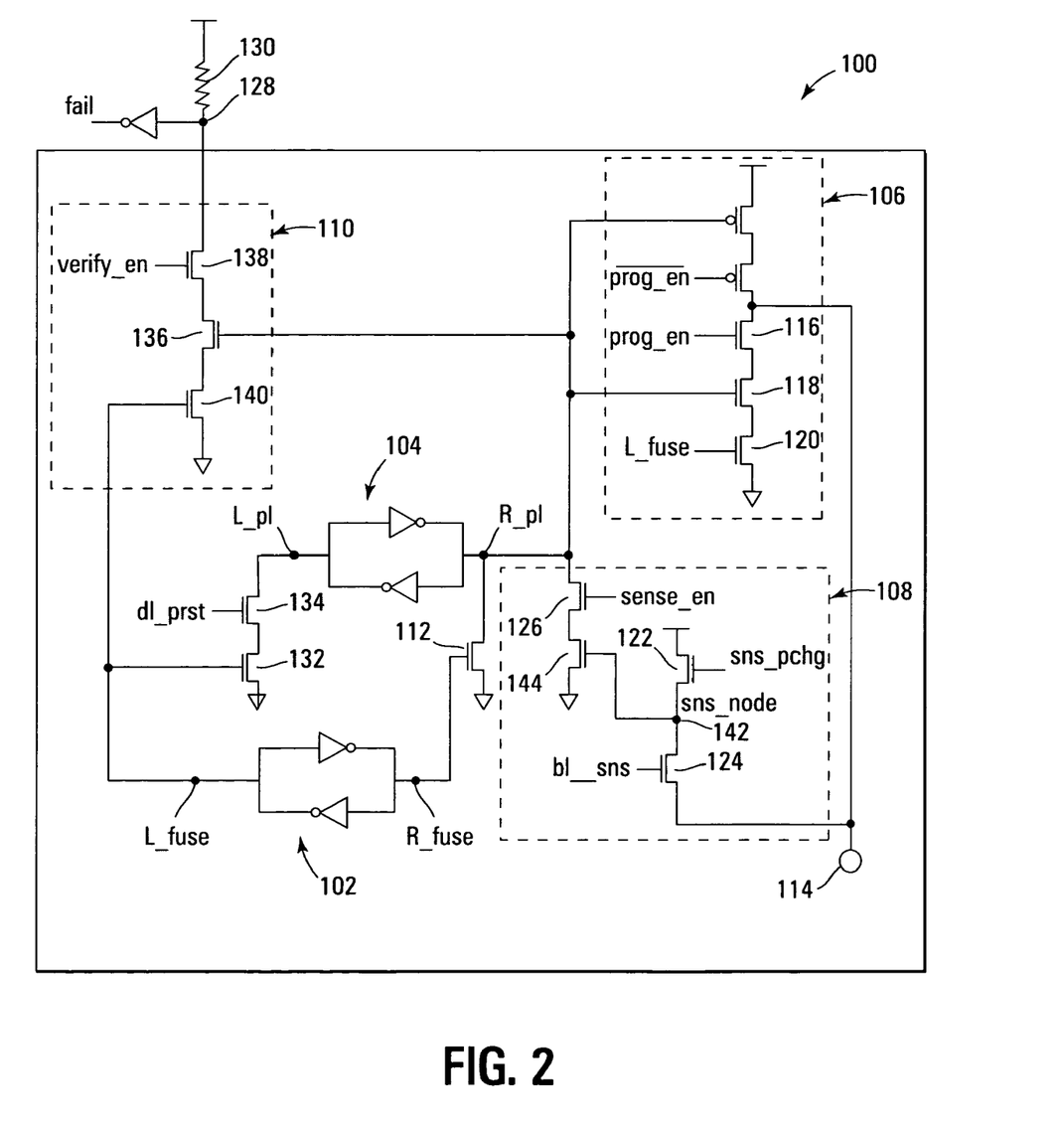
FIG. 2 is a circuit diagram of the embodiment of FIG. 1.

FIG. 2 is a circuit diagram of the embodiment of FIG. 1 shown in greater detail. Bitline disable latch 102 is connected to an input node L_fuse at the left side of the bitline disable latch 102, and has an output node R_fuse at the right side of the bitline disable latch 102. Node R_fuse is connected to the gate of a pulldown transistor 112. Program latch 104 is connected between an input node L_pl at the left side of the program latch 104, and an output node R_pl at the right side of the program latch 104. Program verify circuit 110 is connected between a common node 128 for a memory such as those described below and the input node L_fuse. Bitline conditioning circuit 106 is connected to node R_pl as well as to its respective bitline 114. Read verify sense circuit 108 is connected between node R_pl and its respective bitline 114 as well.

Operation of the bitline disable latch 102 is as follows. Before a program sequence occurs, the bitline disable latch 102 is loaded with a "1" on the left side, at node L_fuse. This logic signal is an indication that the bitline 114 associated with the bitline disable latch 102 is a good bitline for any operation. Loading a "0" at node L_fuse is an indication that the bitline 114 is being excluded from any user operation.

A programming sequence for the memory operates as follows. The program latch 104 is activated by loading the bitline disable latch 102 with a "1" indicating that the bitline is available to perform operations. To program, node L_pl of the program latch 104 is loaded with a "0" to indicate programming is to occur. Loading "0" to the program latch 104 causes the output of the program latch 104, at node R_pl, to be a "1." When program enable signal (prog_en) goes high, that turns transistor 116 of bitline conditioning circuit 106 on, the high signal at node R_pl turns transistor 118 of bitline conditioning circuit 106 on, and if L_fuse is high, indicating that the bitline 114 is available for operations, then transistor 120 of bitline conditioning circuit 106 is turned on as well, and a discharge path exists from the bitline conditioning circuit (described in greater detail below) to ground.

Program and Read-Modify-Write operation for the memory is as follows. Sense precharge signal (sns_pchg,) which is connected to the gate of pullup transistor 122 of read/verify sense circuit 108 is brought low, turning transistor 122 on and pulling node sns_node to Vcc. Bitline sense transistor 124 is therefore supplied to a supply voltage (i.e., approximately 2.1 volts), and the bitline 114 precharges to the supply voltage minus the threshold voltage (i.e., 2.1-$V_T$). Two options are present at this point. First, if the NAND bit being sensed is at a threshold voltage indicating it is erased (that is, logic "1"), charges on the bitline 114 are discharged. This causes the sense node 142 (sns_node) to discharge when bitline sense signal (bl_sns) is supplied with 1.3 volts when sense enable signal switches to logic high to turn on transistor 126. In this situation, the logic state of node R_pl does not change since there is no discharge path. In the other case, if the NAND bit is at a threshold voltage indicating it is programmed (that is, logic "0"), the bitline 114 that was precharged retains its charge since the NAND bit does not create any discharge path. With bitline sense signal biased to 1.3 V., the sense node 142 retains its charge to nearly $V_{cc}$. When the sense enable signal switches to logic high, the R_pl node changes to "0" by being pulled down through transistors 126 and 144, and the program latch 104 is inhibited from a programming operation.

Program verification for the memory functions as follows. The program verify circuit 110 is used to determine if any program latch such as latch 104 of all of the program latches in the memory is failing in programming operations. To verify, node 128 (net_a) is precharged through pullup resistor 130, when R_pl is set to "1." This means that the NAND bit is prohibited from read-modify-write operations, so when a verify enable signal (verify_en) switches to logic high, a discharge path exists in the program verify circuit by virtue of the high signal at the gates of each of transistors 136, 138, and 140, thus discharging node 128 to ground. Any program latch of all the program latches in the system failing to program results in a pulldown of the common node 128 to ground, thus providing a fail signal.

In operation, the circuit and methods work as follows. When a bitline 114 has been excluded from programming and/or verification operations, a logic "0" signal is provided to the bitline disable latch 102. This results in a high signal at node R_fuse, which discharges node R_pl to ground through transistor 112, inhibiting program latch 104 from operation. When a "1" signal is provided to the bitline disable latch 102, then a "0" signal is present at R_fuse, and the bitline 114 is allowed to be used in operations.

The transistors 132 and 134 are for limiting current burning that could occur if both sides of the data latch are at the same logic state. To program "0" data, node L_pl is loaded with a "0" logic level, the program enable signal (prog_en) is set to a "1" state, thus conditioning the bit lines to "0." Transistors 132 and 134 assist in prevention of current burning or crowbar current while the bitline is disabled (when a "0" logic state is loaded to node L_fuse). When a bitline is being excluded from any operation, node R_fuse is at logic state "1." Then transistor 112 pulls node R_pl to logic "0." Transistors 132 and 134 prevent the data latch 104 from having a "0" logic signal on both nodes L_pl and R_pl during a bitline disable condition, thus preventing crowbar current.

Figure 3:
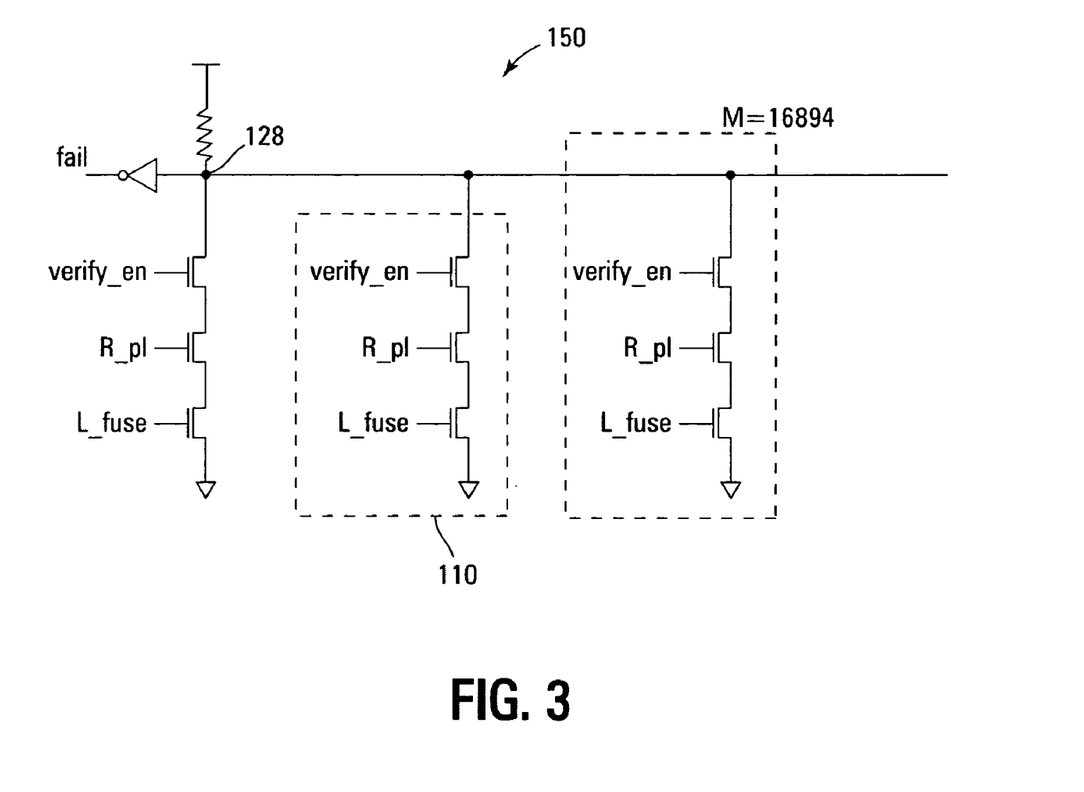

FIG. 3 is a block diagram of an embodiment 150 of the present invention showing the connection of a plurality of verify enable circuits to the common node 128. During a verification process, if a bitline is disabled, then it is being excluded from the verification process by the lack of a high logic signal at the gate of its respective L_fuse transistor. This logic "0" signal removes a discharge path to ground for the respective bitline regardless of the signals at node R_pl or the verify enable signal being at a logic high.

If a program operation for a particular bitline is failing, but the bitline is believed available for operations, then the signals at the transistors of the program verify circuit will all be turned on, and the common node 128 is discharged to ground when the verify enable signal is asserted. When node 128 is pulled to ground, the fail signal switches to logic high, indicating a failure in the programming. When one particular bitline is excluded from verification, its L_fuse node is low, pulling R_pl low, preventing verification of that bitline and operation of the program latch. Therefore, when the fail signal is at a logic high, a bad bitline is excluded if its R_fuse node is high. When the fail signal is at a logic low, there is no problem with verification unless programming fails, which will then drive the fail signal high.

When a bit is programmed properly after a program sequence, node R_pl is pulled down, which cuts off the discharge path from node 128 to ground by turning transistor 136 off. When a program operation does not successfully complete, indicating a program failure, node R_pl stays high, and if the bitline is believed available for operations (node L_fuse is high), node 128 discharges to ground through turned on transistors 138, 136 and 140 when the verify enable signal is switched to high for verification.

It should be understood that logic signals and the assertion thereof as described herein may be changed so that opposite logic signals perform the desired operations, with the proper choice of logic gates and appropriate transistors, and that such a change is within the scope of the invention.

Figure 4:
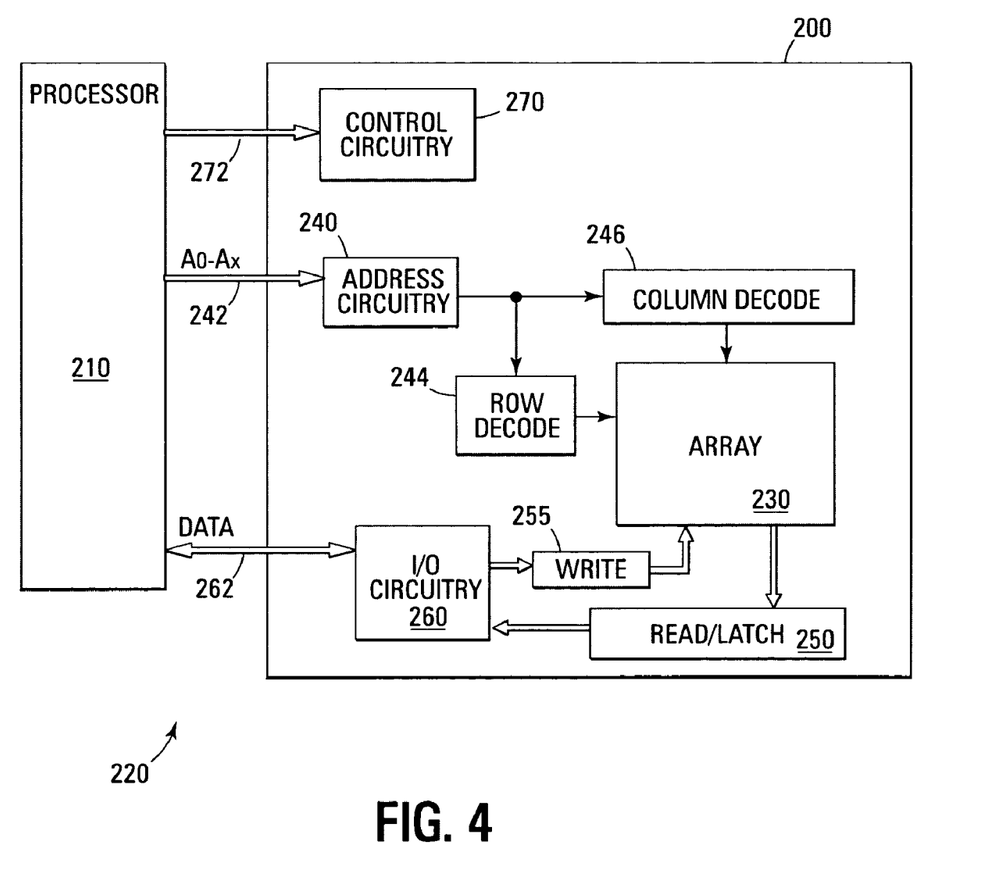
FIG. 4 is a block diagram of a system according to another embodiment of the present invention.

FIG. 4 is a functional block diagram of a memory device 200, of one embodiment of the present invention, which is coupled to a processor 210. The memory device 200 and the processor 210 may form part of an electronic system 220. The memory device 200 has been simplified to focus on features of the memory that are helpful in understanding the present invention. The memory device includes an array of memory cells 230. The memory cells are non volatile floating gate memory cells with vertical floating gates as described above. The memory array 230 is arranged in banks of rows and columns.

An address buffer circuit 240 is provided to latch address signals provided on address input connections A0 Ax 242. Address signals are received and decoded by row decoder 244 and a column decoder 246 to access the memory array 230. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 230 by sensing voltage or current changes in the memory array columns using sense/latch circuitry 250. The sense/latch circuitry, in one embodiment, is coupled to read and latch a row of data from the memory array. Data input and output buffer circuitry 260 is included for bi directional data communication over a plurality of data (DQ) connections 262 with the processor 210.

Command control circuit 270 decodes signals provided on control connections 272 from the processor 210. These signals are used to control the operations on the memory array 230, including data read, data write, and erase operations. The flash memory device has been simplified to facilitate a basic understanding of the features of the memory. A more detailed understanding of internal circuitry and functions of flash memories are known to those skilled in the art.

In the various embodiments of the present invention, the memory 200 has a bitline disable circuit such as circuit 100 for each bitline of the memory.

CONCLUSION

Bitline disable circuitry and related methods have been described that include a bitline disable latch, a program latch, a program verify circuit, a bitline conditioning circuit, and a program verify circuit. The bitline disable latch allows the disabling of a bitline from operations by inhibiting operation of a program latch. Further, if a programming failure occurs in the memory, the circuitry drives the program latch to a state where it cannot program, and indicates a failure to the memory.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of performing operations on a bitline in a memory device, comprising:
    setting a bitline disable latch with a first logic signal indicating exclusion of the bitline or with a second complementary logic signal indicating that the bitline is available for operations: and
    excluding the bitline from operations when a program latch for the bitline fails to program.

2. The method of claim 1, wherein excluding the bitline from operations when a program latch fails to program comprises:
    loading the program latch with a second logic level signal complementary to the first logic level signal;
    attempting to program a bit;
    determining whether the bit has programmed; and
    indicating a failed programming when the bit exhibits an erase threshold voltage.

3. A method of performing operations on a bitline in a memory device, comprising:
    setting a bitline disable latch with a first logic signal indicating exclusion of the bitline or with a second complementary logic signal indicating that the bitline is available for operations; and
    disabling the bitline for verification operation, wherein disabling the bitline for verification operation comprises pulling a verification node to ground.

4. A method of determining whether a programming operation on a bitline in a memory has failed, comprising:
    loading a bitline disable latch with a first logic level signal;
    loading a program latch with a second logic level signal complementary to the first logic level signal;
    attempting to program a bit;
    determining whether the bit has programmed; and
    indicating a failed programming when the bit exhibits an erase threshold voltage.

5. The method of claim 4, and further comprising:
    grounding a common node for the memory to indicate a failed programming operation.

6. The method of claim 5, wherein grounding the common node comprises:
    turning on three transistors, the first transistor gate connected to a program verify signal, the second transistor gate connected to a program latch output signal, and the third transistor gate connected to the bitline disable latch input signal.

7. A method of monitoring programming and verification on a bitline in a memory, comprising:
inhibiting operation of a program latch when a bitline is excluded from operation;
inhibiting operation of the program latch when a bitline is available for operations and the bitline fails a programming operation; and
indicating a failure of programming when the bitline fails the programming operation.

8. The method of claim 7, wherein indicating a failure comprises:
grounding a common node for the memory to indicate a failed programming operation.

9. The method of claim 8, wherein grounding the common node comprises:
turning on three transistors, the first transistor gate connected to a program verify signal, the second transistor gate connected to a program latch output signal, and the third transistor gate connected to the bitline disable latch input signal.

10. A method of monitoring each of a plurality of bitlines in a memory for failed programming operation, comprising:
connecting a plurality of bitline disable circuits, each bitline disable circuit connected to a single bitline of the bitlines in the memory, to a common node;
precharging the common node;
discharging the common node when any of the plurality of bitline disable circuits indicate a failed programming operation.

11. A method of verifying programming on a bitline in a memory, comprising:
precharging a common node for the memory;
checking for a failed program operation on any of a plurality of programming latches in the memory;
discharging the common node when any of the plurality of program latches fails to program; and
asserting a fail signal in response to the discharge of the common node.

12. The method of claim 11, wherein discharging the common node comprises:
turning on three transistors, the first transistor gate connected to a program verify signal, the second transistor gate connected to a program latch output signal, and the third transistor gate connected to the bitline disable latch input signal.

13. A method of programming a bit on a bitline, comprising:
loading a bitline disable latch with a first logic signal indicating a valid operational bitline;
loading a program latch with a complement to the first logic signal;
conditioning a bitline; and
initiating a program operation on the bitline.

14. The method of claim 13, and further comprising:
verifying programming on the bitline.

15. The method of claim 14, wherein verifying programming on the bitline comprises:
precharging a sense node;
precharging a bitline;
sensing the bit on the bitline;
maintaining the status of the program latch output when an erase threshold is sensed; and switching the status of the program latch output when a program voltage is sensed.

16. The method of claim 15, and further comprising:
indicating a failed programming when maintaining is indicated.

17. The method of claim 16, wherein indicating a failed programming comprises:
discharging a node common to each of the circuits.

18. The method of claim 15, wherein switching status comprises:
pulling the output node of the program latch to a second logic level through a discharge path when switching is indicated.

19. The method of claim 18, and further comprising:
inhibiting program latch operation when switching is indicated.

20. A memory device, comprising:
an array of memory cells;
control circuitry to read, write and erase the memory cells;
address circuitry to latch address signals provided on address input connections; and
a circuit to exclude a bad bitline from memory operations and to detect a failed program sequence on a bitline for each of a plurality of bitlines in the memory, the circuit comprising:
a program latch to initiate programming of the memory; and
a bitline disable latch programmable to inhibit operation of the program latch when a bad bitline is indicated.

21. The memory device of claim 20, wherein the circuit further comprises:
a program verify circuit comprising:
first, second, and third transistors connected in series between a charged node and a ground potential, the first transistor gate connected to a verification enable signal, the second transistor gate connected to a program latch output signal, and the third transistor gate connected to a bitline disable latch signal, wherein the node is discharged to ground.

22. The memory device of claim 20, wherein the circuit further comprises:
a read/verify sense circuit comprising:
a sense precharge transistor source to drain connected between a supply voltage and a sense node;
a bitline sense transistor source to drain connected between the sense node and a bitline; and
a transistor gate connected to the sense node, to inhibit operation of a program latch on sensing when a sensed bit on the bitline is programmed.

23. The memory device of claim 20, wherein the memory device is a NAND memory device.

24. The memory device of claim 20, wherein the memory device is a flash memory device.

25. The memory device, of claim 20, wherein the memory device is a non-volatile memory device.

26. A non-volatile memory device, comprising:
an array of floating gate memory cells;
control circuitry to read, write and erase the floating gate memory cells; and
address circuitry to latch address signals provided on address input connections;
a circuit to exclude a bad bitline from memory operations and to detect a failed program sequence on a bitline for each of a plurality of bitlines in the memory; and
a program verify circuit comprising:
first, second, and third transistors connected in series between a charged node and a ground potential, the first transistor gate connected to a verification enable signal, the second transistor gate connected to a program latch output signal, and the third transistor gate connected to a bitline disable latch signal, wherein the node is discharged to ground.

27. The memory device of claim 26, wherein the nonvolatile memory device further comprises a bitline disable circuit comprising:
a program latch to initiate programming of the memory;
a bitline disable latch programmable to inhibit operation of the program latch when a bad bitline is indicated.

28. The memory device of claim 26, wherein the nonvolatile memory device further comprises:
a read/verify sense circuit comprising:
a sense precharge transistor source to drain connected between a supply voltage and a sense node;
a bitline sense transistor source to drain connected between the sense node and a bitline; and
a transistor gate connected to the sense node, to inhibit operation of a program latch on sensing when a sensed bit on the bitline is programmed.

29. An integrated circuit, comprising:
a bitline disable circuit comprising:
a bitline disable latch having an input and an output;
a program latch having an input and an output; and
a first transistor having a gate connected to the output of the bitline disable latch and source to drain connected between the output of the program latch and a ground potential;
a program verify circuit comprising:
second, third, and fourth transistors connected in series between a charged node and a ground potential, the second transistor gate connected to a verification enable signal, the third transistor gate connected to the program latch output signal, and the fourth transistor gate connected to the bitline disable latch input signal; and
a read/verify sense circuit comprising:
a sense precharge transistor source to drain connected between a supply voltage and a sense node;
a bitline sense transistor source to drain connected between the sense node and a bitline; and
a transistor gate connected to the sense node, to inhibit operation of the program latch on sensing when a sensed bit on the bitline is programmed.

30. A bitline disable circuit, comprising:
a bitline disable latch having an input and an output;
a program latch having an input and an output; and
a transistor having a gate connected to the output of the bitline disable latch and source to drain connected between the output of the program latch and ground.

31. A program verify circuit, comprising:
first, second, and third transistors connected in series between a charged node and a ground potential, the first transistor gate connected to a verification enable signal, the second transistor gate connected to a program latch output signal, and the third transistor gate connected to a bitline disable latch signal.

32. A read/verify sense circuit, comprising:
a sense precharge transistor source to drain connected between a supply voltage and a sense node;
a bitline sense transistor source to drain connected between the sense node and a bitline; and
a transistor gate connected to the sense node, to inhibit operation of a program latch on sensing when a sensed bit on the bitline is programmed.

33. A processing system, comprising:
a processor; and
a memory device coupled to the processor to store data provided by the processor and to provide data to the processor, the memory comprising:
an array of memory cells;
control circuitry to read, write and erase the memory cells;
address circuitry to latch address signals provided on address input connections; and
a circuit to exclude a bad bitline from memory operations and to detect a failed program sequence on a bitline for each of a plurality of bitlines in the memory, the circuit comprising:
a program latch to initiate programming of the memory;
a bitline disable latch programmable to inhibit operation of the program latch when a bad bitline is indicated.

34. The system of claim 33, wherein the circuit further comprises:
a program verify circuit comprising:
first, second, and third transistors connected in series between a charged node and a ground potential, the first transistor gate connected to a verification enable signal, the second transistor gate connected to a program latch output signal, and the third transistor gate connected to a bitline disable latch signal, wherein the node is discharged to ground.

35. The system of claim 33, wherein the circuit further comprises:
a read/verify sense circuit comprising:
a sense precharge transistor source to drain connected between a supply voltage and a sense node;
a bitline sense transistor source to drain connected between the sense node and a bitline; and
a transistor gate connected to the sense node, to inhibit operation of a program latch on sensing when a sensed bit on the bitline is programmed.

36. The system of claim 33, wherein the circuit further comprises:
a bitline disable circuit comprising:
a bitline disable latch having an input and an output;
a program latch having an input and an output; and
a first transistor having a gate connected to the output of the bitline disable latch and source to drain connected between the output of the program latch and a ground potential;
a program verify circuit comprising:
second, third, and fourth transistors connected in series between a charged node and a ground potential, the second transistor gate connected to a verification enable signal, the third transistor gate connected to the program latch output signal, and the fourth transistor gate connected to the bitline disable latch input signal; and a read/verify sense circuit comprising:
a sense precharge transistor source to drain connected between a supply voltage and a sense node;
a bitline sense transistor source to drain connected between the sense node and a bitline; and
a transistor gate connected to the sense node, to inhibit operation of the program latch on sensing when a sensed bit on the bitline is programmed.

37. The system of claim 33, wherein the memory device is a NAND memory device.

38. A flash memory device, comprising:
an array of floating gate memory cells;
control circuitry to read, write and erase the floating gate memory cells; and address circuitry to latch address signals provided on address input connections; and a circuit to exclude a bad bitline from memory operations and to detect a failed program sequence on a bitline for each of a plurality of bitlines in the memory, the circuit comprising:

a program latch to initiate programming of the memory;

a bitline disable latch programmable to inhibit operation of the program latch when a bad bitline is indicated.

39. The flash memory device of claim 38, wherein the non-volatile memory device further comprises:

a program verify circuit comprising:

first, second, and third transistors connected in series between a charged node and a ground potential, the first transistor gate connected to a verification enable signal, the second transistor gate connected to a program latch output signal, and the third transistor gate connected to a bitline disable latch signal, wherein the node is discharged to ground.

40. The flash memory device of claim 38, wherein the non-volatile memory device further comprises:

a read/verify sense circuit comprising:

a sense precharge transistor source to drain connected between a supply voltage and a sense node;

a bitline sense transistor source to drain connected between the sense node and a bitline; and a transistor gate connected to the sense node, to inhibit operation of a program latch on sensing when a sensed bit on the bitline is programmed.

* * * * *